United States Patent
Agarwal

(10) Patent No.: US 7,508,075 B2
(45) Date of Patent: Mar. 24, 2009

(54) SELF-ALIGNED POLY-METAL STRUCTURES

(75) Inventor: Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 296 days.

(21) Appl. No.: 11/108,436

(22) Filed: Apr. 18, 2005

(65) Prior Publication Data

US 2005/0181578 A1  Aug. 18, 2005

Related U.S. Application Data

(62) Division of application No. 10/633,165, filed on Aug. 1, 2003, now Pat. No. 7,078,327.

(51) Int. Cl.
H01L 23/48 (2006.01)
H01L 23/52 (2006.01)
H01L 23/40 (2006.01)
H01L 29/78 (2006.01)

(52) U.S. Cl. .............. 257/758; 257/315; 257/412; 257/763

(58) Field of Classification Search .......... 257/734, 257/736, 748, 750, 758, 763, 751, 754, 755, 257/761, 762, 768, 314–315, 412–413
See application file for complete search history.

(56) References Cited

U.S. PATENT DOCUMENTS

| | | | |
|---|---|---|---|
| 4,601,779 A | 7/1986 | Abernathey et al. | |
| 5,368,686 A | 11/1994 | Tatsumi et al. | |
| 5,597,756 A | 1/1997 | Fazan et al. | |
| 5,770,507 A | 6/1998 | Chen et al. | |
| 5,776,823 A | 7/1998 | Agnello et al. | |
| 5,891,784 A | 4/1999 | Cheung et al. | |
| 5,940,315 A | 8/1999 | Cowles | |
| 5,940,718 A | 8/1999 | Ibok et al. | |
| 5,989,959 A | 11/1999 | Araki | |
| 6,043,562 A | 3/2000 | Keeth | |
| 6,063,704 A | 5/2000 | Demirlioglu | |
| 6,072,223 A | 6/2000 | Noble | |
| 6,075,274 A | 6/2000 | Wu et al. | |
| 6,090,660 A | 7/2000 | Noble, Jr. | |
| 6,097,049 A | 8/2000 | Goebel et al. | |
| 6,103,576 A | 8/2000 | Deustcher et al. | |
| 6,107,145 A | 8/2000 | Dennison et al. | |
| 6,121,125 A | 9/2000 | Lee | |
| 6,165,883 A | 12/2000 | Hiura | |
| 6,171,981 B1 * | 1/2001 | Byun ................. 438/785 |
| 6,228,712 B1 * | 5/2001 | Kawai et al. ........ 438/257 |

(Continued)

FOREIGN PATENT DOCUMENTS

| JP | 361208850 A | 9/1986 |
|---|---|---|
| JP | 363114236 A | 5/1988 |
| JP | 363156341 A | 6/1988 |
| JP | 2001-253028 | * 8/2001 |

*Primary Examiner*—Chuong Anh Luu
(74) *Attorney, Agent, or Firm*—Dinsmore & Shohl LLP

(57) ABSTRACT

A semiconductor structure is provided comprising a self-aligned poly-metal stack formed over a semiconductor substrate where the interface between an oxidation barrier placed over the stack and an oxidized portion of the stack lies along the sidewall of the poly-metal stack. A semiconductor structure is also provided where an etch stop layer is present in the poly region of the poly-metal stack. The present invention also relates more broadly to a memory cell array and a computer system including the poly-metal stack of the present invention.

12 Claims, 5 Drawing Sheets

U.S. PATENT DOCUMENTS

| | | |
|---|---|---|
| 6,232,209 B1 | 5/2001 | Fujiwara et al. |
| 6,245,605 B1 | 6/2001 | Hwang et al. |
| 6,268,622 B1 | 7/2001 | Shone et al. |
| 6,320,246 B1 | 11/2001 | Gilton |
| 6,344,364 B1 | 2/2002 | Gilton |
| 6,348,405 B1 | 2/2002 | Ohuchi |
| 6,355,524 B1 | 3/2002 | Tuan et al. |
| 6,379,981 B2 | 4/2002 | Gilton |
| 6,429,109 B1 | 8/2002 | Zheng et al. |
| 6,432,773 B1 | 8/2002 | Gerber et al. |
| 6,458,646 B1 | 10/2002 | Divakaruni et al. |
| 6,630,405 B1 | 10/2003 | Hong et al. |
| 6,699,777 B2 | 3/2004 | Agarwal |
| 6,790,723 B2 * | 9/2004 | Tanaka et al. ............... 438/243 |
| 2001/0018262 A1 | 8/2001 | Hu |
| 2002/0004294 A1 | 1/2002 | Gardner et al. |

* cited by examiner

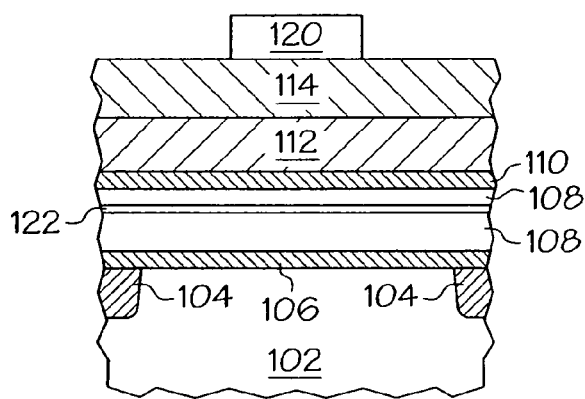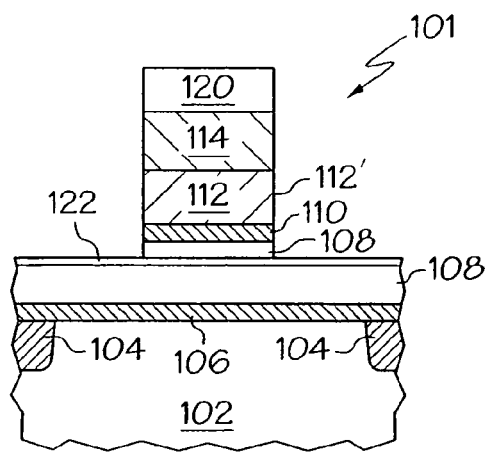
FIG. 6  FIG. 7
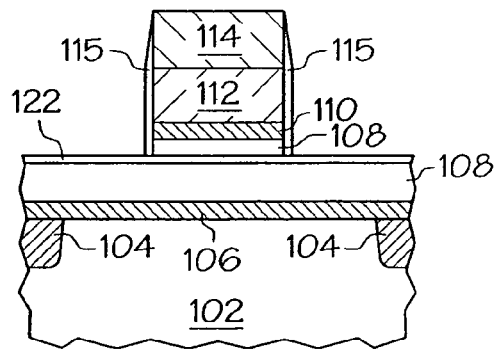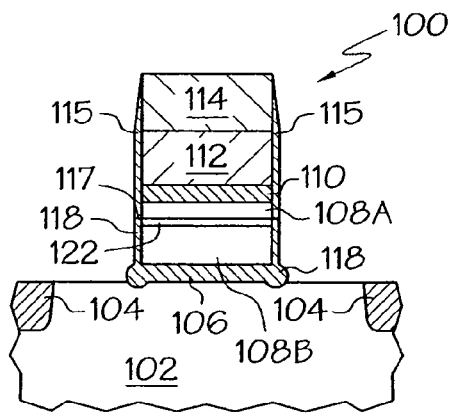
FIG. 8  FIG. 9

SELF-ALIGNED POLY-METAL STRUCTURES

CROSS REFERENCE TO RELATED APPLICATIONS

This application is a division of U.S. patent application Ser. No. 10/633,165, filed Aug. 1, 2003, now U.S. Pat. No. 7,078, 327.

This application is also a member of the following family of related U.S. patent application Ser. Nos.: 09/971,250, filed Oct. 4, 2001, now U.S. Pat. No. 6,699,777; U.S. patent application Ser. No. 10/438,360, now U.S. Pat. No. 6,875,679, which is a division of the above-noted parent application; U.S. patent application Ser. No. 10/633,165, now U.S. Pat. No. 7,078,327, which is a continuation of the above-noted parent application; U.S. patent application Ser. No. 10/894, 292, now U.S. Pat. No. 7,094,673, which is a division of U.S. patent application Ser. No. 10/438,360, now U.S. Pat. No. 6,875,679; U.S. patent application Ser. No. 10/920,848, which is a division of U.S. patent application Ser. No. 10/438, 360, now U.S. Pat. No. 6,875,679; U.S. patent application Ser. No. 11/024,106, now U.S. Pat. No. 7,166,527, which is a continuation of U.S. patent application Ser. No. 10/438,360, now U.S. Pat. No. 6,875,679 and U.S. patent application Ser. No. 11/561,988, which is a continuation of U.S. patent application Ser. No. 11/024,106, now U.S. Pat. No. 7,166,527.

BACKGROUND OF THE INVENTION

The present invention relates to stacked poly-metal structures in semiconductor devices and to processes related to the formation of such structures. The present invention is particularly relevant to the wordline architecture of a DRAM cell, but is also related in a more general sense to the gate conductor architecture of a transistor. The present invention arises from the continuing need in the art for improvements to the materials and processes utilized in semiconductor device fabrication.

BRIEF SUMMARY OF THE INVENTION

Many conductors are particularly well suited for use in semiconductor devices. For example, tungsten and other metals are often used as a part of the wordline architecture of a DRAM cell. Unfortunately, many of these otherwise preferable conductors are also difficult to incorporate in certain device architecture because they are subject to severe degradation during the oxidation steps commonly utilized to construct many semiconductor devices. A number of processing techniques can limit this type of degradation. For example, in the context of the wordline architecture of a DRAM cell, manufacturing steps directed to the formation of oxidation barrier layers are introduced to protect the conductors of the wordline architecture from oxidation. The present invention is directed to improving these manufacturing steps by providing an etch stop layer in a silicon substrate of a semiconductor device. More specifically, the present invention is directed to improving manufacturing steps by providing an etch stop layer in a silicon substrate over which the wordline architecture of a DRAM cell is formed.

In accordance with one embodiment of the present invention, a method of interfacing a poly-metal stack and a semiconductor substrate is provided where an etch stop layer is provided in a polysilicon region of the stack. The present invention also addresses the relative location of the etch stop layer in the polysilicon region and a variety of stack materials and oxidation methods. The etch stop layer may be patterned within the poly or may be a continuous conductive etch stop layer in the poly. The present invention also relates more broadly to a process for forming wordline architecture of a memory cell.

In accordance with another embodiment of the present invention, a semiconductor structure is provided comprising a poly-metal stack formed over a semiconductor substrate where the interface between an oxidation barrier placed over the stack and an oxidized portion of the stack lies along the sidewall of the poly. A semiconductor structure is also provided where a conductive layer is present in the poly region of the poly-metal stack. The present invention also relates more broadly to a memory cell array and a computer system including the poly-metal stack of the present invention.

Accordingly, it is an object of the present invention to provide for improvements to the materials and processes utilized in semiconductor device fabrication. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which:

FIGS. 6-9 illustrate a method of interfacing a poly-metal stack and a semiconductor substrate according to another embodiment of the present invention;

DETAILED DESCRIPTION

Figure 1:
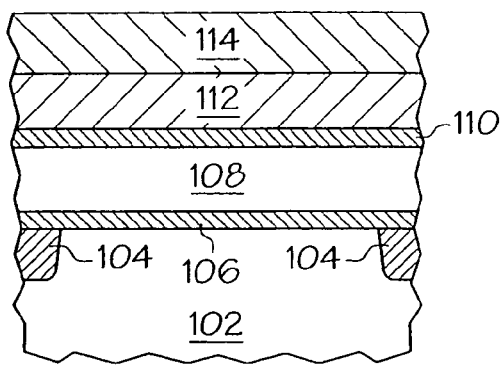
FIGS. 1-5 illustrate a method of interfacing a poly-metal stack and a semiconductor substrate according to one embodiment of the present invention.

Referring initially to FIGS. 1-5, a method of interfacing a poly-metal stack 100 and a semiconductor substrate 102 according to one embodiment of the present invention is illustrated. Initially, referring to FIG. 1, a multi-layer poly-metal structure is formed over the semiconductor substrate 102. As will be appreciated by those skilled in the art of semiconductor fabrication, a variety of components may be utilized to form a poly-metal structure for use in a memory device. In the illustrated embodiment, the poly-metal structure initially includes a gate dielectric or other oxide layer 106, a polysilicon layer or region 108, a barrier layer 110, a metal layer 112, typically tungsten, and a silicon dioxide layer 114. Conventional isolation regions 104 are also illustrated. The oxide layer 106 typically comprises a silicon dioxide layer. The present invention is particularly advantageous in the context of tungsten-based metal layers 112 because it relates to a process by which the metal layer may be shielded from oxidation in a precise manner.

Figure 2:
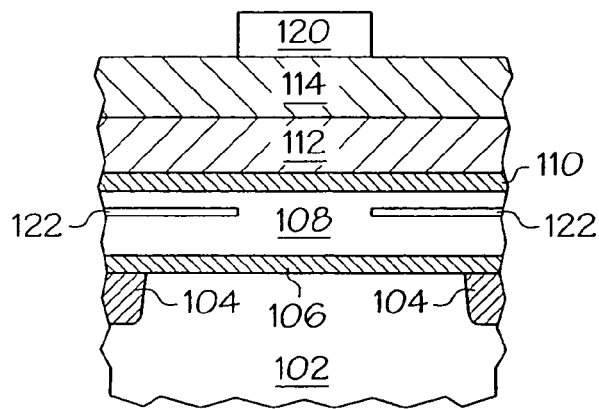

Referring specifically to FIG. 2, an etch stop layer 122 is formed in the polysilicon region 108 of the poly-metal structure with the aid of a masking layer 120. The etch stop layer 122 may be formed through ion implantation of oxygen or nitrogen, to form a SiOx or a SiNx etch stop layer 122 in the polysilicon region 108. The patterned etch stop layer 122 may also be formed through implantation of carbon, fluorine or any other suitable material capable of forming an etch stop layer in cooperation with polysilicon. It is noted that the polysilicon region 108 is typically doped to render it conductive. It is also noted that the etch stop layer 122 is described herein as patterned in the sense that it forms a non-continuous layer relative to the surface of the semiconductor substrate 102.

Figure 3:
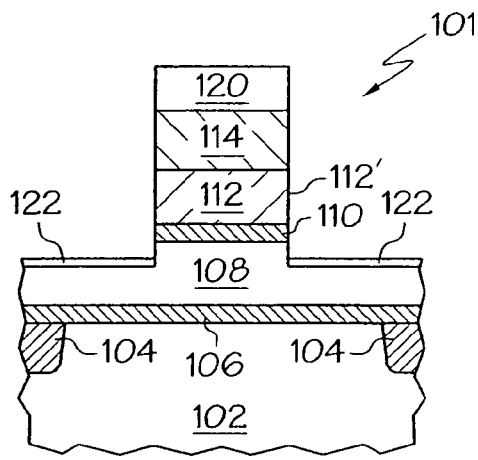

As is illustrated in FIG. 3, portions of the poly-metal structure extending from an upper surface 124 of the poly-metal structure to the etch stop layer 122 are removed to form a partial poly-metal stack 101 including an exposed metal region 112' along a sidewall of the stack 101. Portions of the polysilicon layer 108, the barrier layer 110, and the silicon dioxide layer 114 are also exposed along the sidewall of the stack 101.

Figure 4:
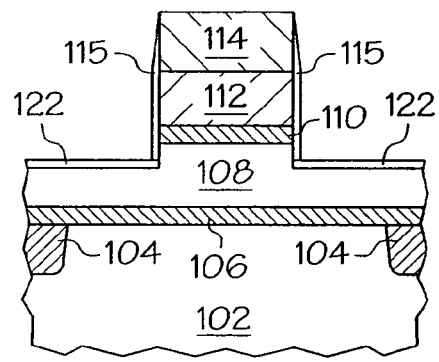

Next, as is illustrated in FIG. 4, the exposed metal region 112' is covered with an oxidation barrier layer or sidewall spacer 115. The barrier layer 115 may comprise a nitride, an oxide, or a layer of oxide and a layer of nitride.

Figure 5:
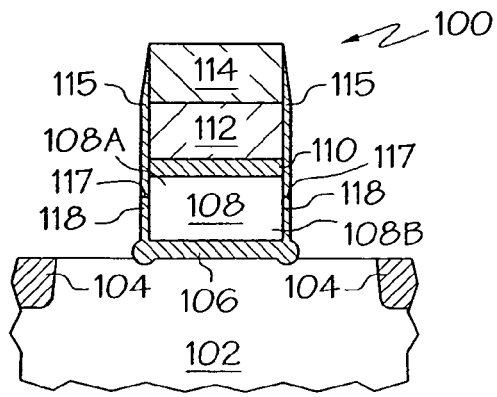

Finally, referring to FIG. 5, the etch stop layer 122, or at least portions thereof, are removed to expose a region of the oxide layer 106 along the sidewall, forming a full poly-metal stack 100. The poly-metal stack 100 and the semiconductor substrate 102 are interfaced by subjecting the exposed regions of the oxide layer 106 and the polysilicon layer 108 to an oxidation process. The oxidation process forms an oxidized layer 118 along the exposed oxide and polysilicon regions. The oxidized layer 118 and the oxidation barrier layer 115 interface along the sidewall at a boundary 117 defined between upper and lower polysilicon regions 108A, 108B of the polysilicon layer 108.

The position of the etch stop layer 122 can be controlled with great precision. The position of the boundary 117 is a direct function of the position of the etch stop layer 122 and defines specific operating characteristics of the associated semiconductor device. Accordingly, the process illustrated in FIGS. 1-5 is particularly advantageous in large scale, multi-cell semiconductor device manufacture because operational uniformity across the entire device may be optimized by controlling the point at which the boundary 117 lies along the sidewall of the stack 100 with great precision.

The process illustrated in FIGS. 6-9 is similar to that illustrated in FIGS. 1-5 with the exception that the etch stop layer 122 is formed as a continuous layer of conductive material in the polysilicon layer 108. The continuous layer may be formed by providing the polysilicon layer 108 in a plurality of structural layering steps and forming the etch stop layer 122 in the polysilicon region through an intermediate layering step. The conductive etch stop layer 122 may be formed from silicon and germanium or any other material or combination of materials suitable for use as a conductive etch stop layer. The dopant present in the polysilicon region 108 of the poly-metal structure may be used to form the conductive etch stop layer 122 by forming the etch stop layer 122 of a material that will accept transfer of a quantity of the dopant from the polysilicon region 108 to the etch stop layer 122.

Conventional CMOS integrated circuits utilizing clad silicide on moats suffer from potential leakage paths along the sidewall surface of the etched polysilicon gates, a region where the electrical field strength is high due to enhanced electric field lines at the edge of the polysilicon conductor. Many types of semiconductor devices, such as DRAMs and EPROMs minimize this problem by oxidizing the gate polysilicon after the gate etch to form a high quality interface at the edge of the polysilicon. Enhanced oxidation under the gate edge is often referred to as the smile effect. The irregular shape of the oxidized layer 118 in FIGS. 5 and 9 is intended to highlight the smile effect.

In the context of the present invention, the poly-metal stack 100 and the semiconductor substrate 102 of the present invention may be interfaced through selective or non-selective oxidation. Preferably, the poly-metal stack 100 and the semiconductor substrate are interfaced through oxidation by $O_2$; $H_2O$; $H_2$ and $H_2O$; $H_2$ and $O^-$, $H_2$ and $O_2$; $H_2$ and activated $O_2$; $H_2$ and $O_3$; or combinations thereof. The oxidants may be accompanied by argon or helium. $H_2$ and $H_2O$ oxidants may be derived from catalytic conversion of $H_2$ and $O_2$. Activated $O_2$ may be derived through activation by a remote plasma unit.

For the purposes of describing and defining the present invention, it is noted that an etch stop layer formed "in" the polysilicon region may be formed at a surface of the polysilicon region or within the polysilicon region between its upper and lower surfaces. A layer formed "at" a surface of a region may be formed directly on the surface or may be partially embedded in the region so as to define a portion of the surface of the region. In the embodiment of FIGS. 2 and 6, the etch stop layer 122 is formed within the polysilicon layer 108. It should be further noted that, for the purposes of defining and describing the present invention, "on" a substrate or layer denotes formation in contact with the surface of the substrate or layer and "over" a substrate or layer denotes formation above or in contact with the surface of the substrate or layer.

Figure 10:
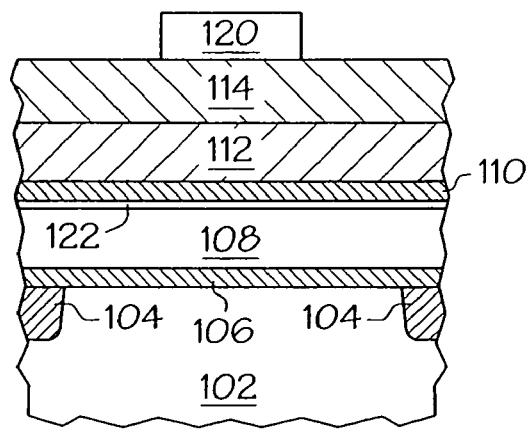
FIGS. 10-13 illustrate a variety of etch stop layers for use in the method of the present invention.
Figure 11:
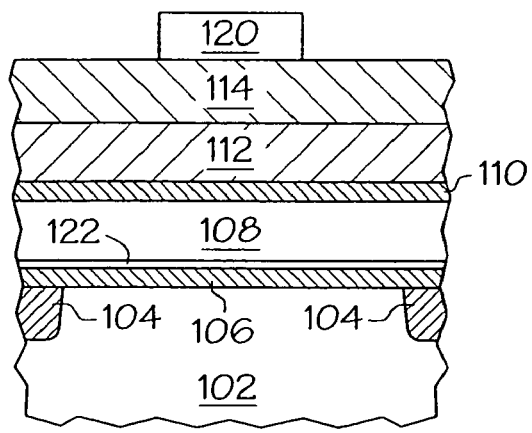
Figure 12:
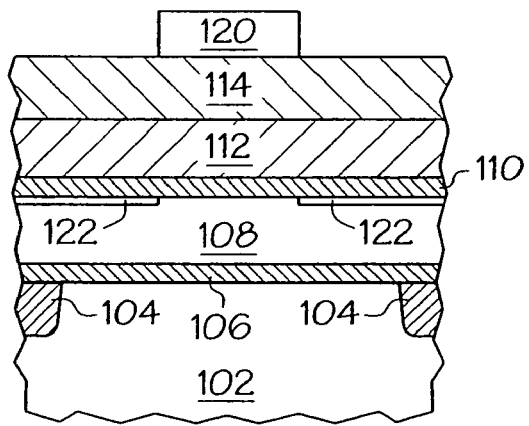
Figure 13:
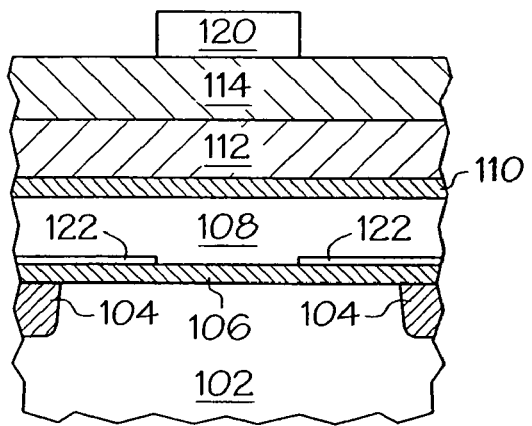

Referring now to FIGS. 10 and 12, it is noted that the etch stop layer of FIGS. 2 and 6 may be formed at an upper surface of the polysilicon region 108. Similarly, referring to FIGS. 11 and 13, the etch stop layer 122 may be formed at a lower surface of the polysilicon region 108.

For the purposes of defining and describing the present invention, it is noted that a poly-metal structure comprises a structure that includes a polysilicon region and a metal region. The poly-metal structure may include materials or regions in addition to the polysilicon region and the metal region. The polysilicon region may be doped or undoped and the metal region may be a pure metal, e.g. tungsten, or a metal-based material, e.g., tungsten, a tungsten-containing alloy, tungsten nitride, tungsten silicide, etc. As is noted above, a variety of components may be utilized to form a poly-metal structure for use in a memory device according to the present invention.

In the embodiment illustrated in FIGS. 1, 6, and 10-13, the poly-metal structure comprises a gate dielectric or other oxide layer 106, a polysilicon layer or region 108, a barrier layer 110, a metal layer 112, and a silicon dioxide layer 114. However, it is noted that a variety of additional poly-metal structures fall within the scope of the present invention. For example, referring to FIG. 14, the silicon dioxide layer 114 may be replaced by a layer 114' of $Si_3N_4$ or any other suitable material. Similarly, the barrier layer 110, which may comprise tungsten nitride, tungsten silicide, tungsten silicide nitride, titanium nitride, titanium silicide nitride, and combinations thereof may be replaced by one or more alternative layers or may be accompanied by additional layers of different materials.

Figure 14:
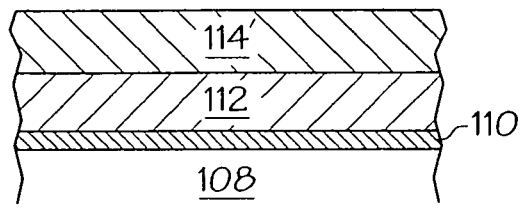
FIGS. 14-19 illustrate a variety of poly-metal structure configurations for use in the method of the present invention.
Figure 15:
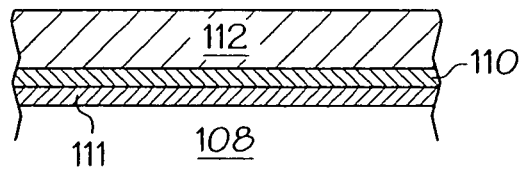
Figure 16:
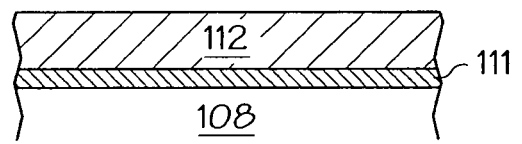
Figure 17:
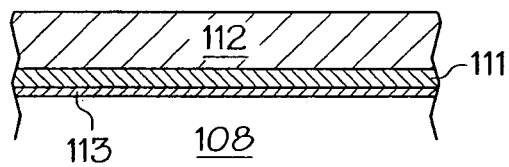
Figure 18:
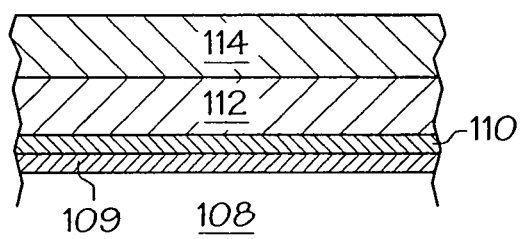
Figure 19:
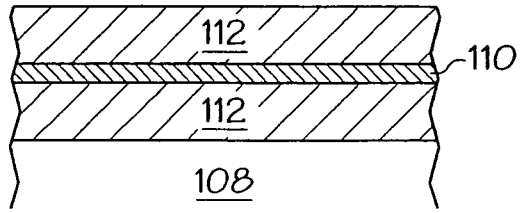

Referring to FIG. 14, for example, the metal layer 112 may comprise tungsten and the barrier layer 110 may comprise tungsten nitride or tungsten silicide nitride. Alternatively, referring to FIG. 15, a titanium nitride layer 111 may be provided between the polysilicon layer 108 and a tungsten nitride layer 110. Referring to FIGS. 16 and 17, it is noted that the metal layer 112 may comprise tungsten and the barrier layer may comprise a titanium nitride layer 111 or a titanium nitride layer 111 in combination with a titanium silicide nitride layer 113. Referring to FIG. 18, the poly-metal structure may be formed such that the metal layer 112 comprises tungsten and the barrier layer comprises tungsten silicide nitride 110 formed over tungsten silicide 109. Finally, referring to FIG. 19, it is noted that a barrier layer 110, e.g., tungsten nitride, may be interposed between a pair of metal layers 112, e.g., tungsten. In many instances, a tungsten nitride layer may be interposed between the tungsten layer 112 and the barrier layer 110.

Figure 20:
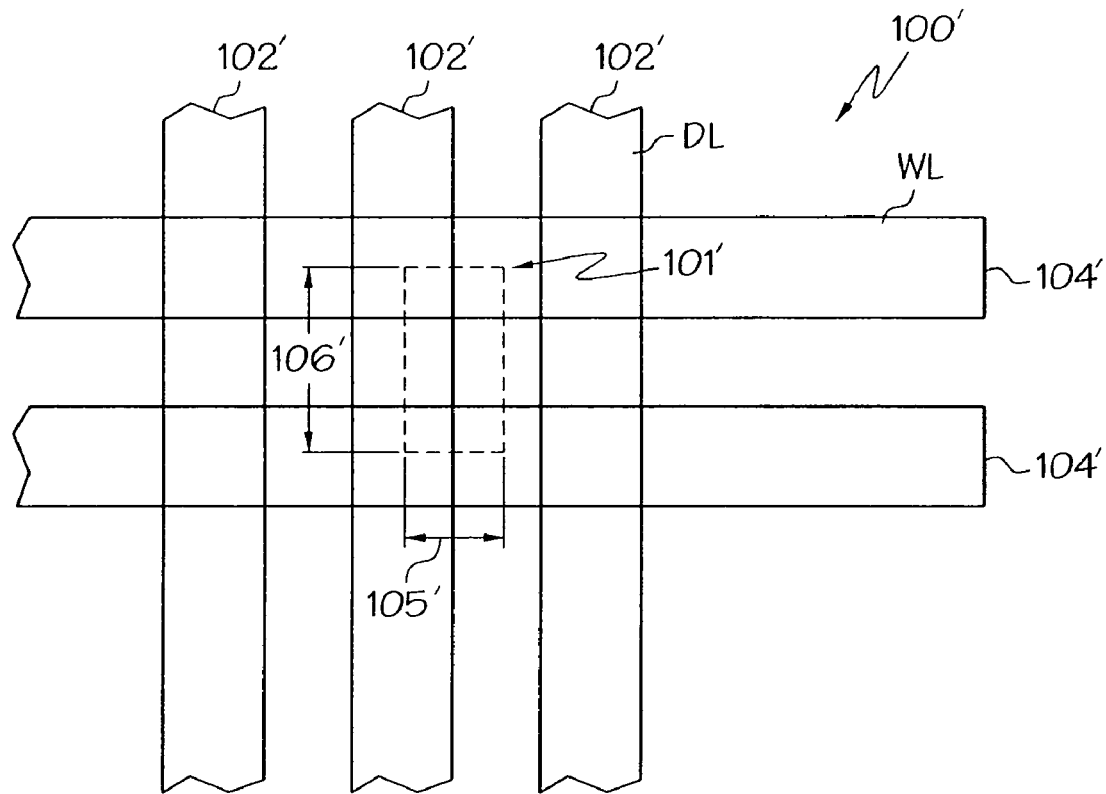
FIG. 20 is a general schematic illustration of a memory cell array according to the present invention.

FIG. 20 illustrates a top view layout of a memory device 100' including wordlines 104', digitlines 102', and a unit cell or memory cell 101'. The unit cell or memory cell 101' is one of many cells of the memory device 100'. The memory cell 101' illustrated in FIG. 20 has a feature size 105' in a first dimension that is half of the digitline pitch and a feature size 106' in a second dimension which matches the wordline pitch. It is noted that the present invention is not, however, limited to memory cells of a particular feature size. Nor is the present invention limited to particular wordline, digitline, or memory cell layout or geometry.

Figure 21:
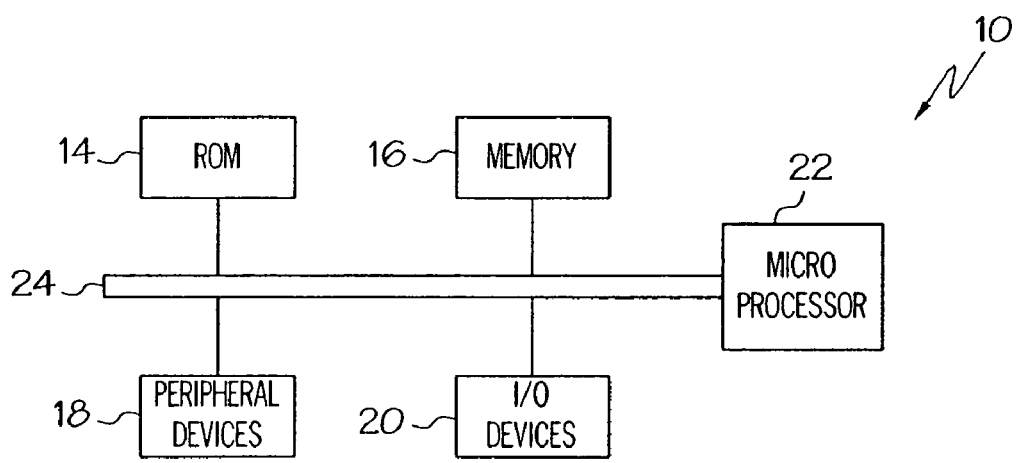
FIG. 21 is a general schematic illustration of a computer system according to the present invention.

FIG. 21 is an illustration of a computer system 10 that can use and be used with embodiments of the present invention. The computer system 10 can be a desktop, network server, handheld computer or the like. As will be appreciated by those skilled in the art, the computer system 10 would include ROM 14, mass memory 16, peripheral devices 18, and I/O devices 20 in communication with a microprocessor or programmable controller 22 via a data bus 24 or another suitable data communication path. The memory devices 14 and 16 can be fabricated according to the various embodiments of the present invention. ROM 14 can include EPROM, EEPROM, flash memory, or any other suitable ROM. Mass memory 16 can include DRAM, synchronous RAM, flash memory, or any other suitable mass memory.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A semiconductor structure comprising:
a semiconductor substrate;
a multi-layer self-aligned poly-metal stack formed over said semiconductor substrate, wherein said poly-metal stack comprises a metal region, an upper polysilicon region, a lower polysilicon region, and a boundary defined between said upper and lower polysilicon regions aligned along a sidewall of said stack;
an oxidation barrier layer comprising at least one nitride formed along a portion of said sidewall of said poly-metal stack covering said metal region and said upper polysilicon region; and
an oxidized layer formed along a portion of said sidewall of said poly-metal stack covering said lower polysilicon region, wherein said oxidized layer and said oxidation barrier layer interface along said sidewall at the boundary defined between said upper and lower polysilicon regions.

2. A semiconductor structure as claimed in claim 1 wherein said poly-metal stack further comprises an insulating layer formed over said metal layer.

3. A semiconductor structure as claimed in claim 2 wherein said insulating layer is aligned with said metal region, said upper polysilicon region, and said lower polysilicon region along said sidewall of said stack.

4. A semiconductor structure as claimed in claim 2 wherein said insulating layer comprises a silicon dioxide layer.

5. A semiconductor structure as claimed in claim 2 wherein said oxidation barrier layer formed along a portion of said sidewall of said poly-metal stack covers said insulating layer.

6. A semiconductor structure as claimed in claim 1 wherein said oxidized layer further covers an oxide region of said poly-metal stack along said sidewall of said stack.

7. A semiconductor structure as claimed in claim 1 further comprising an etch stop layer formed in said poly-metal stack.

8. A semiconductor structure as claimed in claim 7 wherein said oxidized layer and said oxidation barrier layer interface along said sidewall at a point defined by said etch stop layer.

9. A semiconductor structure as claimed in claim 7 wherein said etch stop layer is formed between said upper and said lower polysilicon regions of said poly-metal stack.

10. A semiconductor structure as claimed in claim 7 wherein said etch stop layer comprises a conductive etch stop layer.

11. A memory cell array comprising an array of wordlines and digitlines arranged to access respective memory cells within said array, wherein respective ones of said wordlines comprise a multi-layer self aligned poly-metal stack formed over said semiconductor substrate, wherein:
said poly-metal stack comprises a metal region, an upper polysilicon region, a lower polysilicon region, and a boundary defined between said upper and lower polysilicon regions aligned along a sidewall of said stack;
an oxidation barrier layer comprising at least one nitride is formed along a portion of said sidewall of said poly-metal stack covering said metal region and said upper polysilicon region; and
an oxidized layer is formed along a portion of said sidewall of said poly-metal stack covering said lower polysilicon region, wherein said oxidized layer and said oxidation barrier layer interface along said sidewall at the boundary defined between said upper and lower polysilicon regions.

12. A computer system comprising a memory cell array in communication with a microprocessor via a data communication path, wherein:
said memory cell array comprises an array of wordlines and digitlines arranged to access respective memory cells within said array;
respective ones of said wordlines comprise a multi-layer self-aligned poly-metal stack formed over said semiconductor substrate;
said poly-metal stack comprises a metal region, an upper polysilicon region, a lower polysilicon region, and a boundary defined between said upper and lower polysilicon regions aligned along a sidewall of said stack;
an oxidation barrier layer comprising at least one nitride is formed along a portion of said sidewall of said poly-metal stack covering said metal region and said upper polysilicon region; and
an oxidized layer is formed along a portion of said sidewall of said poly-metal stack covering said lower polysilicon region, wherein said oxidized layer and said oxidation barrier layer interface along said sidewall at the boundary defined between said upper and lower polysilicon regions.

* * * * *